US006989550B2

(12) United States Patent
Nakahara et al.

(10) Patent No.: US 6,989,550 B2
(45) Date of Patent: Jan. 24, 2006

(54) DISTRIBUTED FEEDBACK SEMICONDUCTOR LASER EQUIPMENT EMPLOYING A GRATING

(75) Inventors: Kouji Nakahara, Kunitachi (JP); Tomonobu Tsuchiya, Hachiouji (JP); Akira Taike, Kokubunji (JP); Kazunori Shinoda, Tokorozawa (JP)

(73) Assignees: Hitachi, Ltd., Tokyo (JP); Opnext Japan, Inc., Kanagawa (JP)

( * ) Notice: Subject to any disclaimer, the term of this patent is extended or adjusted under 35 U.S.C. 154(b) by 0 days.

(21) Appl. No.: 10/606,834

(22) Filed: Jun. 27, 2003

(65) Prior Publication Data

US 2004/0099859 A1 May 27, 2004

(30) Foreign Application Priority Data

Nov. 26, 2002 (JP) ............................. 2002-341668

(51) Int. Cl.
*H01L 27/15* (2006.01)

(52) U.S. Cl. ............................ 257/14; 257/98; 372/50; 372/103

(58) Field of Classification Search .................. 257/14, 257/79, 76, 78, 98–103, 200, 201; 372/20, 372/45, 50, 96, 103; 117/97, 106, 952
See application file for complete search history.

(56) References Cited

U.S. PATENT DOCUMENTS

| | | | | |
|---|---|---|---|---|
| 4,599,728 A * | 7/1986 | Alavi et al. | .................... | 372/45 |
| 4,811,353 A * | 3/1989 | Noda et al. | .................... | 372/45 |
| 2002/0131466 A1 * | 9/2002 | Salvatore et al. | ............. | 372/50 |

FOREIGN PATENT DOCUMENTS

| | | |
|---|---|---|
| JP | 11-054837 | 2/1999 |

OTHER PUBLICATIONS

Itaya et al., “New 1.5 micron Wavelength GalnAsP/InP Distributed Feedback Laser”, Electronics Letter, vol. 18, No. 23, Nov. 1982, pp. 1006-1008.*

Murai, H. et al.; “Lasing characteristics under high temperature operation of 1.55 $\mu$m strained InGaAsP/InGaAIAs MQW laser with InAIAs electron stopper layer”, Electronics Letters, vol. 31, Issue 24, Nov. 23, 1995 pp 2105-2107.*

IEEE Journal of Quantum Electronics, vol. 30, No. 2, Feb. 1994, pp. 511-521.

10th International Conference on Indium Phosphide and Related Materials, 1998, ThP55, pp. 729-732.

2001 Autumn Japan Society of Applied Physics Annual Meeting Proceedings, 13p-B-16, p. 869.

Optical Fiber Communication Conference 2002, Technical Digest ThF3, pp. 417-418.

* cited by examiner

*Primary Examiner*—Minhloan Tran
*Assistant Examiner*—Thomas Dickey
(74) *Attorney, Agent, or Firm*—Mattingly, Stanger, Malur & Brundidge, P.C.

(57) ABSTRACT

The prior art distributed feedback laser having an InGaAlAs active layer involves a problem that its laser characteristics are deteriorated at high temperature due to the high device resistance. According to the present invention, a ridge type laser is fabricated by: forming an InGaAlAs-MQW layer 104 on a n-type InP substrate 101; growing a p-type InGaAlAs-GRIN-SCH layer 105, a p-type InAlAs electron stopping layer 106 and a p-type grating layer 107 in this order on the InGaAlAs-MQW layer 104; forming a grating; and regrowing a p-type InP cladding layer 108 and a p-type InGaAs contact layer in this order. The concave depth of the grating is smaller than the thickness of the p-type grating layer 107.

22 Claims, 15 Drawing Sheets

EPITAXIAL GROWTH

FABRICATION OF GRATING

REGROWTH

CROSS SECTIONAL VIEW

BAND STRUCTURE

P-P' CROSS SECTIONAL VIEW

Q-Q' CROSS SECTIONAL VIEW

InGaAlAs-MQW

InGaAsP-MQW

DISTRIBUTED FEEDBACK SEMICONDUCTOR LASER EQUIPMENT EMPLOYING A GRATING

BACKGROUND OF THE INVENTION

1. Field of the Invention

The present invention relates to a semiconductor-used laser device and, in particular, a semiconductor laser for use as a light source for optical fiber transmission.

2. Related Arts

With the spread of the Internet on a global scale, an amount of data traffic in optical communication networks is increasing mainly due to data communications. Accordingly there is an expanding demand for light sources for 10 Gb/s or higher speed transmission over a relatively short distance of several ten kilometers between high-speed router devices. Such light sources for optical transmission are required to be compact, low power-consuming and inexpensive. As light sources for 10 Gb/s transmission, semiconductor lasers integrated with electro-absorption modulators are already put to practical use. However, integrating a semiconductor laser with an electro-absorption modulator requires a higher manufacture cost. Further, since the modulator theoretically operates only in a limited temperature range due to the dependence of the semiconductor's band gap upon the temperature, it requires a thermoelectronic cooler element such as a Peltier device. The Peltier device is expensive and consumes much current, making it difficult to meet the requirements for the aforementioned light source in terms of cost and power consumption. In this field of application, a conventional directly modulated laser is preferable whose optical output is directly modulated by increasing and decreasing the drive current without using a thermoelectronic cooler element. In principle, however, laser characteristics of a semiconductor laser deteriorates as the temperature rises. In particular, semiconductor lasers with InGaAsP multi-quantum well (MQW) active layers, which are used in 1.3–1.55 $\mu$m band optical communications, do not show good laser characteristics at high temperatures and are not suitable for high speed operation due to the low relaxation oscillation frequency fr. Note that as known, the relaxation oscillation frequency of a directly modulated laser should be not lower than 13 GHz if the laser is used at a modulation speed (bit rate) of 10 Gb/s.

To the contrary, semiconductor lasers having InGaAlAs MQW structures as active layers show good laser characteristics even at high temperatures as disclosed by Chung-En Zah et al. in "IEEE Journal of Quantum Electronics, Vol. 30, No. 2, pp. 511–522, 1994". In addition, as disclosed by T. Ishikawa et al. at "International Conference on Indium Phosphide and Related Materials 1988, ThP-55, pp. 729–732", InGaAlAs-MQW semiconductor lasers have higher relaxation oscillation frequencies than InGaAsP-MQW semiconductor lasers. These disclosures indicate that InGaAlAs-MQW semiconductor lasers are more suitable for use as the aforementioned directly modulated lasers.

Superiority of the InGaAlAs-MQW structure in terms of laser characteristics to the InGaAsP-MQW structure is attributable to its band lineup. That is, as shown in FIG. 11, the ratio of the discontinuity of the conduction band between the quantum well layers and barrier layers to the discontinuity of the valence band between the quantum well layers and barrier layers is 7:3 in the InGaAlAs-MQW structure while this ratio is 6:4 in the InGaAsP-MQW structure. Thus, in the InGaAlAs-MQW structure, small effective mass electrons are more likely to be confined in the quantum well layers and large effective mass holes are more likely to be distributed uniformly in the quantum well layers. In FIG. 11, numeral 1101 is a quantum well of the InGaAlAs-MQW structure, numeral 1102 is a barrier layer of the InGaAlAs-MQW structure, numeral 1103 is a quantum well layer of the InGaAsP-MQW structure and numeral 1104 is a barrier layer of the InGaAsP-MQW structure. However, due to the effective mass of an electron in the semiconductor, at most a tenth of a hole, some electrons leak into a p-type InP cladding layer outside the well layers although the wells of the conduction band in the InGaAlAs-MQW structure are deep. To satisfactorily confine electrons, an InAlAs electron-stopping layer 106 is added to the outside of a p-type SCH layer as shown in FIG. 12 or FIG. 13. In FIG. 12, numeral 105 is a p-type InGaAlAs GRIN-SCH (Graded-Index Separate Confinement Heterostructure) where the Ga content relative to the Al content is gradually changed to modify the band gap so that light can be confined satisfactorily. SCH layers are also called optical guide layers. Numeral 106, is a p-type InAlAs electron stopping layer. Numeral 103 is an n-type InGaAlAs GRIN-SCH and numeral 102 is an n-type InAlAs layer. In FIG. 13, numeral 1301 is a p-type InGaAlAs SCH layer and 1302 is an n-type InGaAlAs SCH layer. Numeral 106 is an InAlAs layer. Due to the large discontinuity of the conduction band, the InAlAs layer 106 can stop electrons coming from the n-type layer side 102 or 1302. Thus, good laser characteristics can be obtained even at high temperatures.

Another invention concerning the InGaAlAs-MQW active layer is disclosed in Japanese Patent Laid-open No. 1998-54837. In addition, 10 Gb/s operation has been realized in the range of −10° C. to 85° C. as disclosed by the authors at "2001 Autumn JSAP (Japan Society of Applied Physics) Annual Meeting, Proceedings, 13p-B-6, p. 869".

However, these disclosed lasers are the so-called FP (Fabry-Perot) type lasers. Since a FP laser uses two cleaved facets of the semiconductor as mirrors to form a resonance cavity, optical spectra oscillate concurrently at multiple wavelengths, and therefore it is said that its maximum transmission distance is 600 m to 2 km. Since high-speed routers are distant from each other up to several tens of kilometers as mentioned earlier, it is desirable to provide a InGaAlAs-MQW laser which oscillates in a single mode. An example of a single mode oscillation distributed feedback laser with an InGaAlAs-MQW structure is disclosed in Japanese Patent Laid-open No. 2002-57405. In this example, an InGaAsP grating is floated in an InP cladding. As disclosed by T. Takiguchi et al. in "Optical Fiber Communication Conference 2002, Technical Digest, ThF3, pp. 417–418", however, 10 Gb/s operation of the laser having this floating-type grating structure is not achieved beyond 75° C. This is because the device resistance is high. The following discusses its reason with general reference to the process. First, as shown in FIG. 5, a multi-layered structure is epitaxially grown on a n-type InP substrate 101. In FIG. 5, numeral 502 denotes a n-type SCH layer, numeral 503 an active layer, numeral 504 a p-type SCH layer, numeral 505 a p-type InP layer, numeral 506 a p-type InGaAsP etch stopping layer, numeral 507 a p-type InP layer and numeral 508 p-type InGaAsP layer. Then, after a grating pattern is formed on the p-type InGaAsP layer 508. by holographic lithography or EB (Electron Beam) lithography, the p-type InGaAsP layer 508 is etched by selective wet etching to form a grating layer as shown in FIG. 6. FIG. 7 is a cross sectional view of FIG. 6 taken along line A–A'.

The problem of the increasing device resistance is introduced at this time before the InP layer or the like is regrown on the grating in FIG. 6 or FIG. 7. When the grating is formed and exposed to the atmosphere, n-type impurity dopants such as Si and O inevitably stick to the grating, which equivalently lowers the carrier density in this interface region of the p layer and therefore raises the resistance. In compound semiconductors such as InP, p-type resistivity is higher than n-type resistivity and therefore lowering the p-type carrier density raises the resistivity more greatly, resulting in a remarkable increase in the resistance. In FIG. 7, numeral 701 denotes n-type impurity dopants such as Si and O. One method for removing the impurity dopants is to dissipate them in a vacuum at high temperatures before the regrowth. In the case of compound semiconductors, particularly InGaAsP and InP, however, the effect of the grating is lost since convex and concave features are flattened if they are exposed at 500° C. or higher temperature. Another method is to perform carrier compensation by excessive p-type doping. For InP and InGaAsP, Zn is used as a p-type dopant. Therefore, carriers may be compensated by introducing a great amount of Zn during the epitaxial growth of the multi-layered structure in FIG. 5 or the regrowth of the InP layer in FIG. 6 or 7. However, since the saturation density of Zn in a InP layer is low in general, it is difficult to compensate carriers in the region of the InP layer 507 exposed to the bottom of the grating in the structure of FIG. 7. Rather, this method may become a cause to raise the resistance.

After the InP layer is regrown, an InGaAs contact layer is grown. Then, etching is performed to form a mesa, a ridge-shaped structure as shown in FIG. 8. In FIG. 8, numeral 108 denotes a p-type InP cladding layer and numeral 109 denotes a p-type InGaAs contact layer. FIG. 9 is a cross-sectional view of FIG. 8 taken along line A–A'. In FIG. 9, holes injected from the p-type InGaAs contact layer 109 flow downward. However, since notches are formed around each bar of the InGaAsP grating layer 508 due to the difference in bandgap, current is difficult to flow via the bars of the InGaAsP grating layer. This situation is described below with reference to FIG. 10 which shows the band structures taken along respective lines P–P' and Q–Q' in FIG. 10. FIG. 10(*a*) shows the band structure in cross section taken along line P–P'. The right one is the conduction band while the left one is the valence band. In this figure, bands 1001, 1002 and 1003 respectively correspond to the p-type InP cladding layer 108, p-type InGaAsP grating layer 508 and p-type InP layer 507 which are p-type doped layers in the state of thermal equilibrium. It is understood from this figure that in the P–P' cross section containing a bar of the grating layer, p-type carriers move to low band gap places, resulting in notches formed. Meanwhile, there is no notch in the Q–Q' cross section containing no bar of the grating layer. Accordingly, since the current flow gets out of the bars of the grating layer as indicated with an arrow, the equivalent current flow area is halved, which raises the resistance. In summary, this grating structure has two factors to increase the device resistance. One is impurity dopants on the regrowth interface and the other is notches in the grating layer.

In the case of a distributed feedback laser having a InGaAsP active layer, a grating is formed in an InGaAsP SCH layer as disclosed in, for example, M. Okai, "Journal of Applied Physics, Vol. 75, No. 1, pp. 1–29, 1994". FIG. 14 shows its schematic view. In FIG. 14, numeral 101 denotes a n-type InP substrate, numeral 1402 a n-type InGaAsP SCH layer in which a grating is formed, numeral 1403 an InGaAsP-MQW active layer, numeral 1404 a p-type InGaAsP SCH layer, numeral 108 a p-type InP cladding layer and numeral 109 a p-type InGaAs layer.

It is a first object of the present invention to provide a semiconductor laser or semiconductor laser-integrated light source characterized in that the laser's device resistance is small, the laser can operate at high speed with good laser characteristics even at high temperatures and the laser oscillates in a single mode.

Further, it is a second object of the present invention to provide a semiconductor laser or semiconductor laser-integrated light source characterized in that the laser is a ridge-type laser operating in a single mode, the laser's device resistance is small and the coupling coefficient of the grating and the width of the ridge feature can be controlled independently of each other.

Still further, it is a third object of the present invention to provide a semiconductor laser or semiconductor laser-integrated light source characterized in that the laser operates in a single mode, the laser's device resistance is small, the coupling coefficient of the grating is large and characteristics of the laser, particularly the threshold current and efficiency, do not deteriorate at high temperatures.

SUMMARY OF THE INVENTION

The first object of the present invention is achieved by an optical semiconductor device comprising: an InP substrate; a plurality of layers, stacked on the InP substrate, including a multi-quantum well active layer made of InGaAlAs; and an InGaAlAs optical guide layer, an InAlAs electron stopping layer, an InGaAsP layer including a grating and an InP cladding layer which are stacked on the multi-quantum well active layer in this order; wherein a concave depth of the grating included in the InGaAsP layer is smaller than a thickness of the InGaAsP layer.

The second object of the present invention is achieved by an optical semiconductor device comprising: an InP substrate; a plurality of layers, stacked on the InP substrate, including a multi-quantum well active layer made of InGaAlAs; and an InGaAlAs optical guide layer, an InAlAs electron stopping layer, an InGaAsP layer including a grating, an InP spacer layer, an InGaAsP etch stopping layer and an InP cladding layer which are stacked on the multi-quantum well active layer in this order; wherein a concave depth of the grating included in the InGaAsP layer is smaller than a thickness of the InGaAsP layer.

The third object of the present invention is achieved by a semiconductor optical device in which a portion of an InGaAsP layer including a grating consists of a multi-quantum well layer.

BRIEF DESCRIPTION OF THE DRAWINGS

Other objects and advantages of the invention will become apparent from the following description of embodiments with reference to the accompanying drawings in which.

PREFERRED EMBODIMENTS OF THE INVENTION

Embodiment 1

Figure 1:
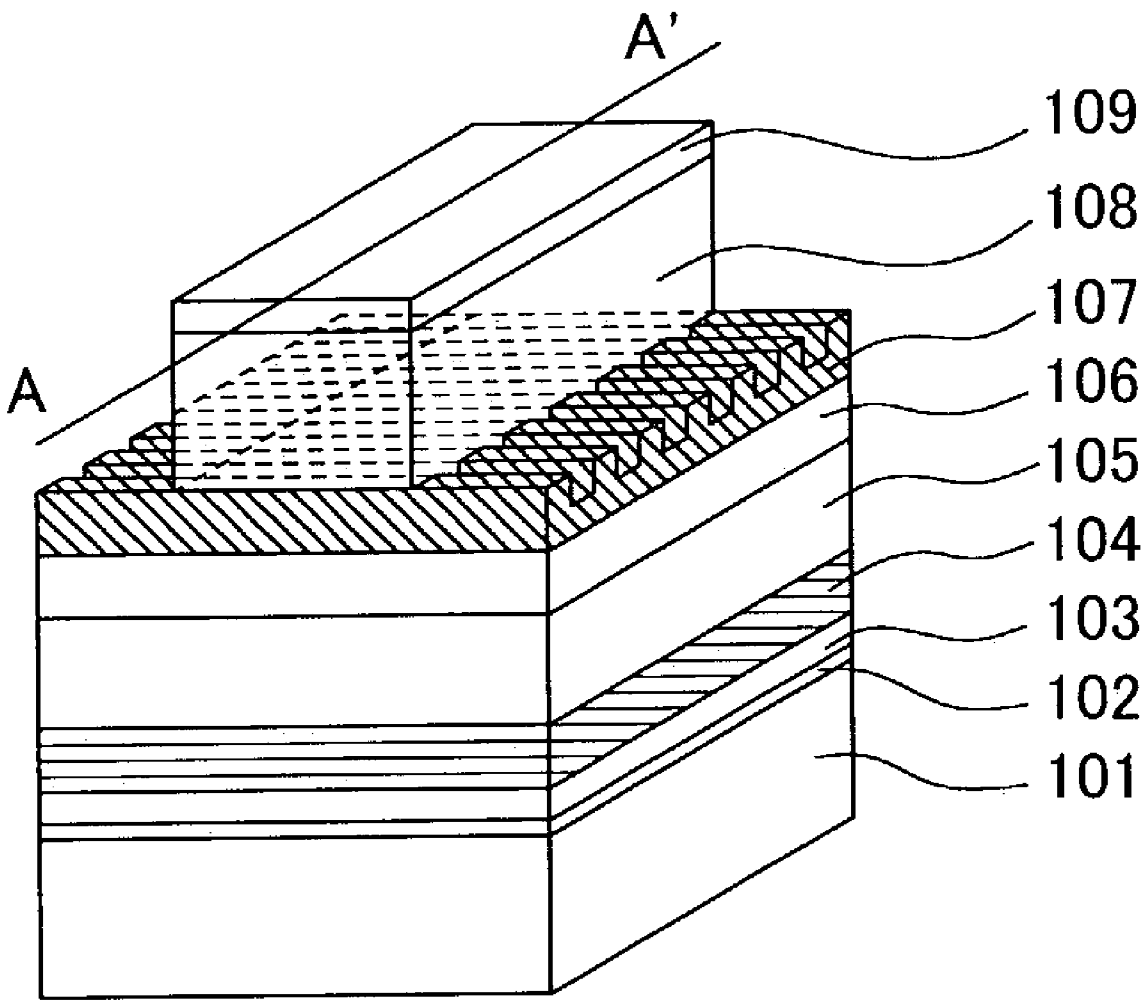
FIG. 1 is a perspective view showing the structure of a first embodiment of the present invention.
Figure 2A:
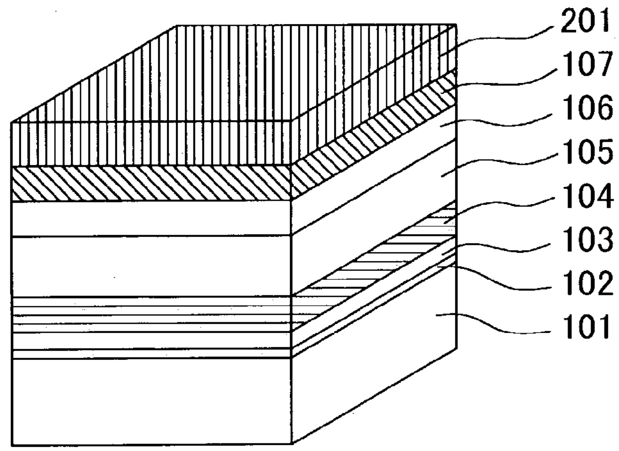
FIGS. 2(*a*), 2(*b*), and 2(*c*) illustrate the processes of obtaining the structure of the first embodiment.
Figure 2B:
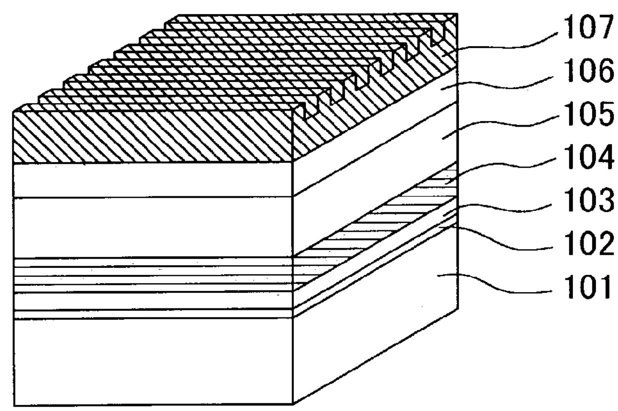
Figure 2C:
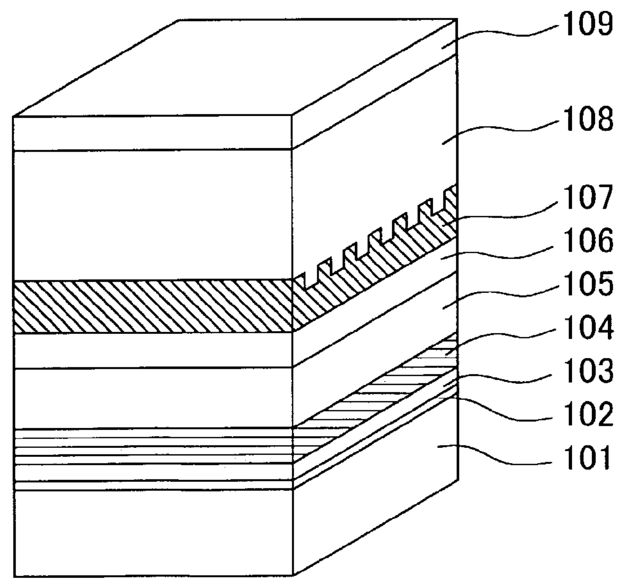
Figure 3:
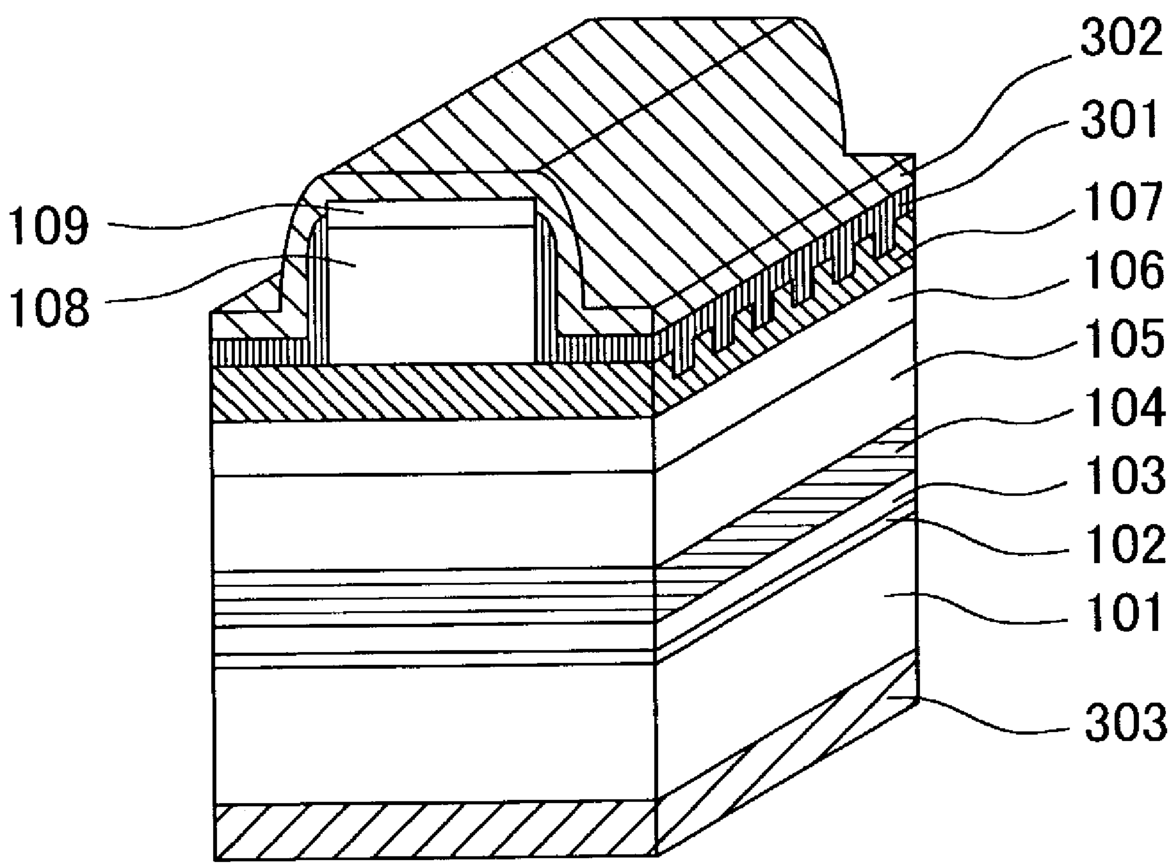
FIG. 3 shows the structure of the first embodiment of the present invention.

A first embodiment is an example of applying the present invention to 1.3 $\mu$m band communication distributed feedback ridge type laser. FIG. 1 is its perspective view before the dielectric protection layer and electrode are formed. In FIG. 1, numeral 101 is a n-type InP substrate which also serves as a lower cladding layer. Numeral 102 is a 30 nm-thick n-type InAlAs layer, numeral 103 is a doped ($1\times10^{18}$ cm$^{-3}$) 0.08 $\mu$m-thick n-type InGaAlAs GRIN-SCH layer. Numeral 104 is a 0.1185 $\mu$m-thick undoped InGaAlAs-MQW structure consisting of seven well and barrier layers. Each well layer is 5.5 nm thick and 1.4% strained compressively while each barrier layer is 10 nm thick and 0.6% strained tensilely. The composition is controlled so as to set the oscillation wavelength to 1.3 $\mu$m. Numeral 105 is a doped ($6\times10^{17}$ cm$^{-3}$) 0.04 $\mu$m-thick p-type InGaAlAs GRIN-SCH layer. Numeral 106 is a doped ($9\times10^{17}$ cm$^{-3}$) 0.04 $\mu$m-thick p-type InAlAs electron stopping layer. Numeral 107 is a doped ($1.4\times10^{18}$ cm$^{-3}$) 0.07 $\mu$m-thick p-type InGaAsP grating layer. The composition wavelength of the grating layer 107 is 1.15 $\mu$m. Numeral 108 is a doped ($1.2\times10^{18}$ cm$^{-3}$) 1.5 $\mu$m-thick p-type InP first upper cladding layer, a 1.6 $\mu$m-wide ridge-shaped mesa stripe. Numeral 109 is a contact layer to provide ohmic contact with an electrode and is made of p-type InGaAs which is lattice-matched with the InP substrate. The following briefly describes the process sequence until the structure shown in FIG. 1 is fabricated. First, as shown in FIG. 2(*a*), the multiple layers up to the grating layer 107 are epitaxially grown successively on the n-type InP substrate by MOCVD (Metal Organic Chemical Vapor Deposition). MOCVD, which is also called as MOVPE (Metal Organic Vapor Phase Epitaxy), is superior in the uniformity of deposition on a wafer scale. Then, a $SiO_2$ film 201 is formed on the top of it by plasma CVD and a 200 nm-period grating pattern of resist is formed on the $SiO_2$ film 201 by holographic lithography or EB lithography. The $SiO_2$ film is etched by dry etching to form a grating pattern of $SiO_2$ on the layer 107. Then, using this grating pattern of $SiO_2$ as a mask, the grating is transferred to the grating layer 107 by semiconductor dry etching with a methane-based gas. This etching must be stopped halfway in the layer 107 so as to set the convex height of the grating to 0.03 $\mu$m. Dry etching allows 0.025 $\mu$m fine processing since it can precisely control the amount of etching uniformly on a wafer scale and its etching direction is well perpendicular (anisotropic). Then, to eliminate damage, the InGaAsP grating layer is lightly etched with the depth of 0.005 $\mu$m by using a $H_3PO_4$ and $H_2O_2$ solution-based etchant. FIG. 2(*b*) shows the device after the $SiO_2$ mask is removed. Thereafter, the p-type InP cladding layer 108 and the p-type InGaAs layer 109 are successively grown by a MOCVD method (FIG. 2(*c*)). On this multilayered structure, a mesa pattern is formed by photolithography. The InGaAs layer 109 is etched by wet etching with a $H_3PO_4$ and $H_2O_2$ solution-based etchant to form a mesa stripe mask. Further, the InP cladding layer 108 is etched with a HCl and acetic acid-based etchant. Since this etching stops at the grating layer 107 made of InGaAsP, the device is shaped as shown in FIG. 1. This structure is coated with a $SiO_2$ protection film 301. Then, after the $SiO_2$ protection film is removed only from the top of the mesa by the self-alignment method, a p-side electrode 302 and a n-side electrode 303 are formed as shown in FIG. 3.

Here, the reason why the present invention decreases the device resistance as compared with the prior art will the device resistance as compared with the prior art will be described in detail. As mentioned earlier, the high device resistance of the prior art is attributable to two reasons. One reason is that carrier compensation is not possible during regrowth over the grating. To the contrary, in the present embodiment, the regrowth interface is fully covered with InGaAsP as shown in FIG. 2(*b*). Due to the high saturation density of Zn, a p-type dopant, it is possible to raise the initial Zn doping level enough highly to achieve carrier compensation and reduce the device resistance. In Table 1, a prior art distributed feedback laser having a floating-type grating layer and the present embodiment are compared regarding the device resistance. We fabricated the compared experimental samples by changing the initial Zn (carrier) doping level.

TABLE 1

| Initial Zn Doping Level for Regrowth (cm$^{-3}$) | | $1\times10^{18}$ | $2\times10^{18}$ |
|---|---|---|---|
| Device Resistance (Ω) | Floating-type Grating | 10 | 10 |
| | Embodiment 1 | 8.5 | 6.5 |

Figure 15:
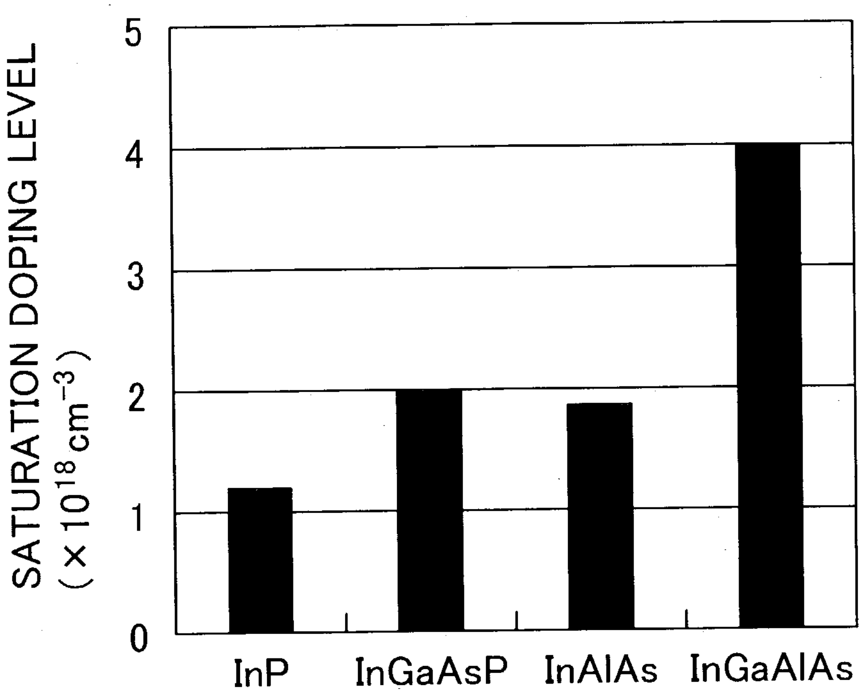
FIG. 15 is a diagram indicating the dependence of the saturation carrier (Zn) density upon materials.

As shown in Table 1, in the case of the conventional floating-type grating, raising the carrier (Zn) doping level did not lower the device resistance. As mentioned earlier under "Related Arts", this is because the concave bottom of the grating is an InP layer. Since the saturation density of Zn in this layer is low, raising the Zn doping level during regrowth merely caused Zn to diffuse into the underlayer of the InP layer. To the contrary, the structure of the present embodiment obtained a carrier compensation effect by raising the Zn doping level as indicated by the decreased resistance. Note that when a layer is grown with Zn doped at the saturation or over-saturation level as in the case of this experiment, care is needed so as to prevent Zn diffusion into the MQW layer. If quantities of Zn (about $1\times10^{18}$ cm$^{-3}$ or more) penetrate into the MQW active layer, laser characteristics, such as threshold current and efficiency, deteriorate. As shown in FIG. 15, in the structure of the present embodiment, not only the InGaAsP grating layer 107 but also the InAlAs electron stopping layer 106 and InGaAlAs GRIN-SCH layer 105 above the MQW layer show high saturation doping levels. Therefore, Zn diffusion is stopped in this region before Zn is diffused into the MQW active layer.

Figure 4A:
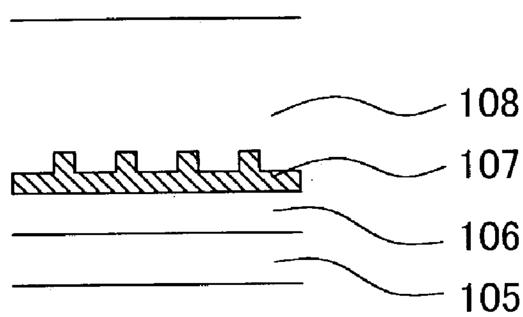
FIG. 4(*a*) is a cross-sectional view showing the structure of the first embodiment, taken along line A–A' of FIG. 1 and FIG. 4(*b*) is a diagram of its band structure, explaining an effect of the present invention.
Figure 4B:
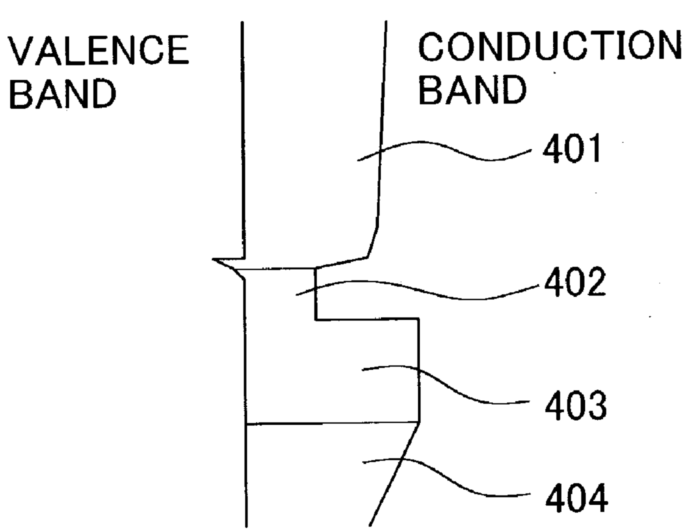
Figure 5:
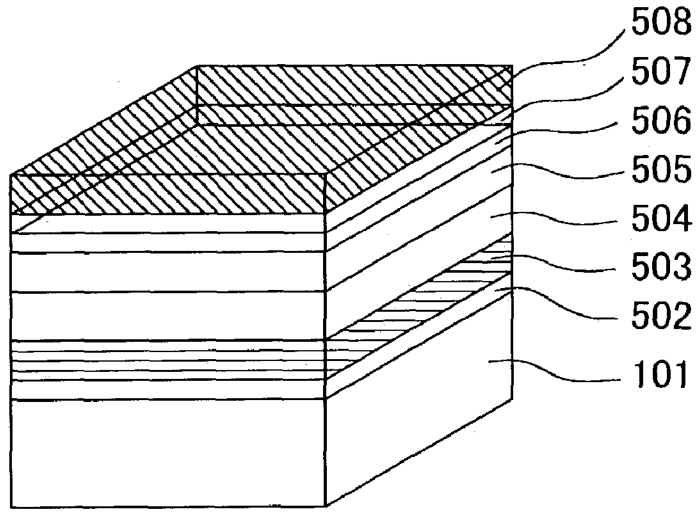
FIG. 5 shows the structure of a prior art example.
Figure 6:
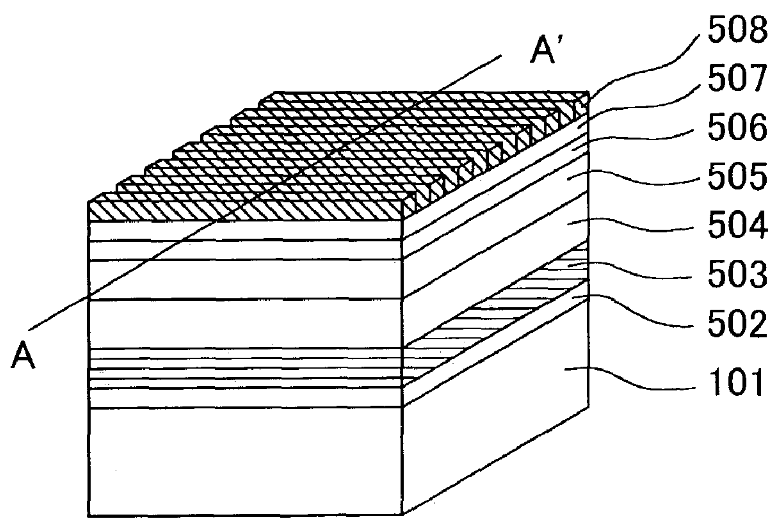
FIG. 6 shows the structure of the prior art example.
Figure 7:
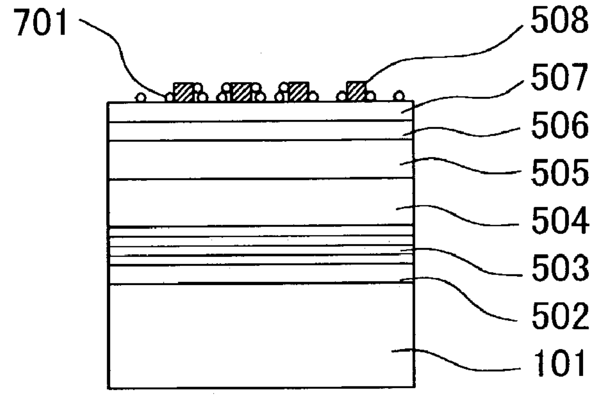
FIG. 7 shows the structure of the prior art example.
Figure 8:
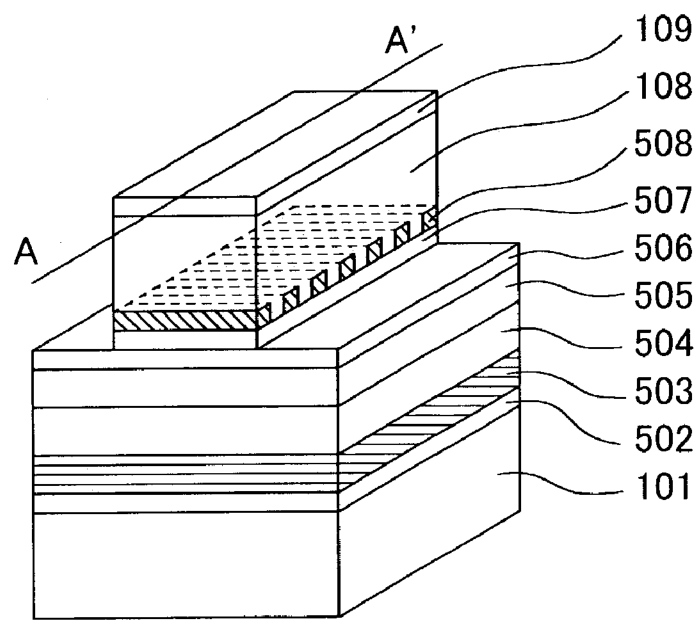
FIG. 8 shows the structure of the prior art example.
Figure 9:
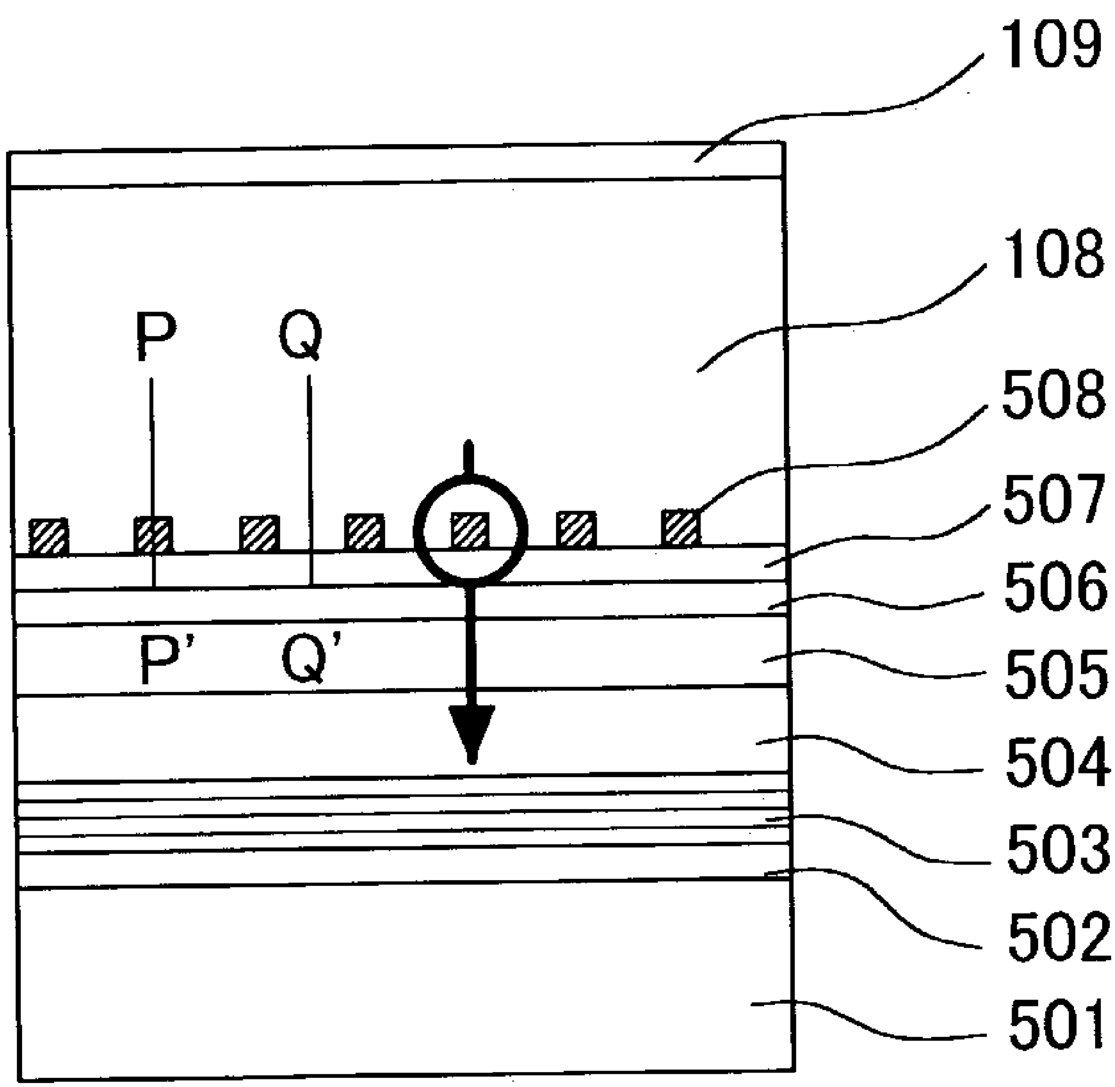
FIG. 9 shows the structure of the prior art example.
Figure 10A:
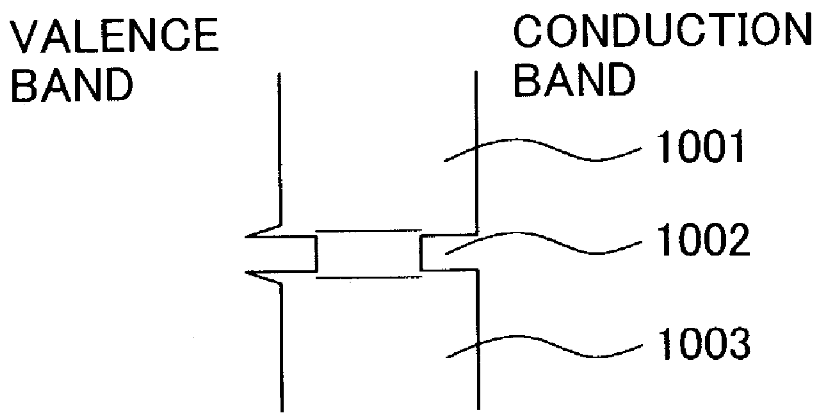
FIGS. 10(*a*) and 10(*b*) are cross-sectional views taken along lines P–P' and Q–Q', respectively, in FIG. 9.
Figure 10B:
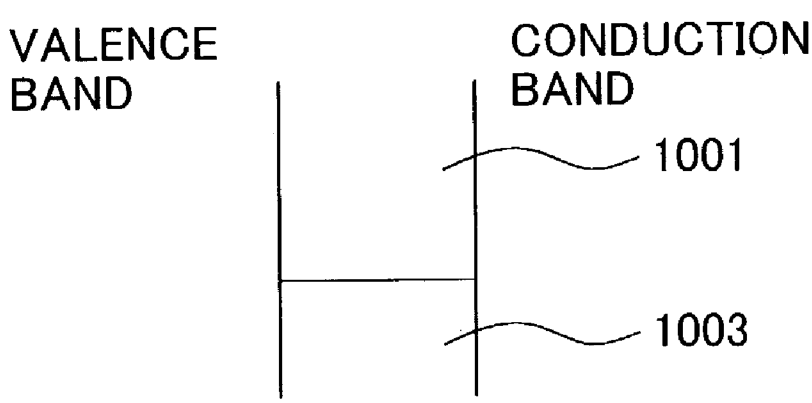
Figure 11A:
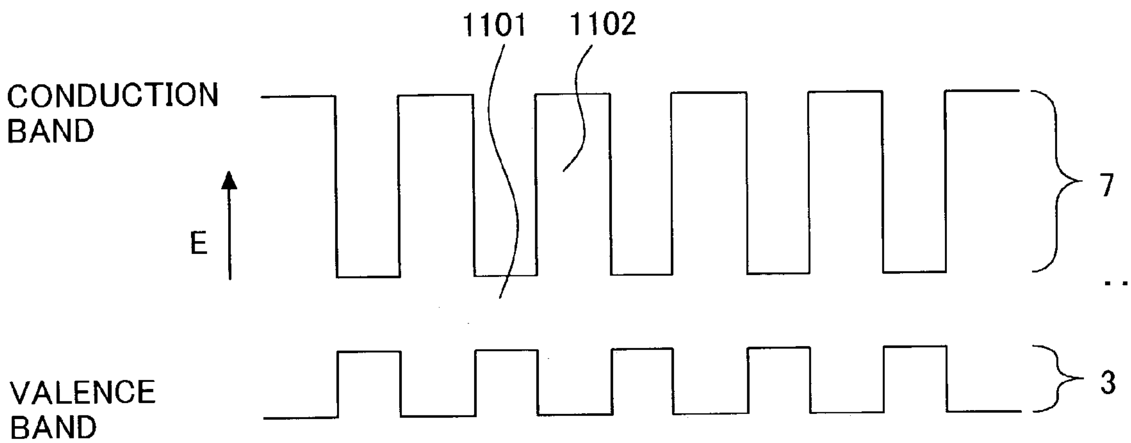
FIGS. 11(*a*) and 11(*b*) are diagrams showing the band structure of an InGaAlAs-MQW layer and that of an InGaAsP-MQW layer, respectively.
Figure 11B:
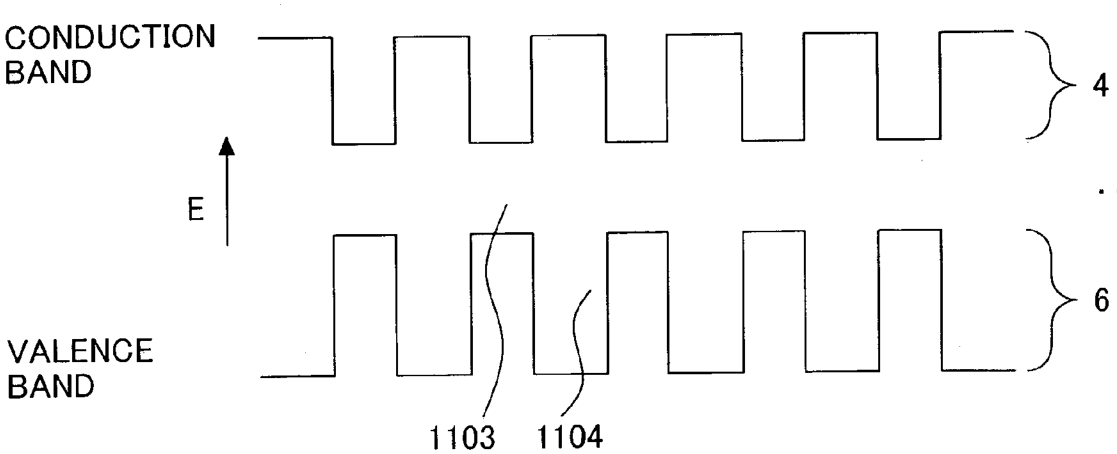
Figure 12:
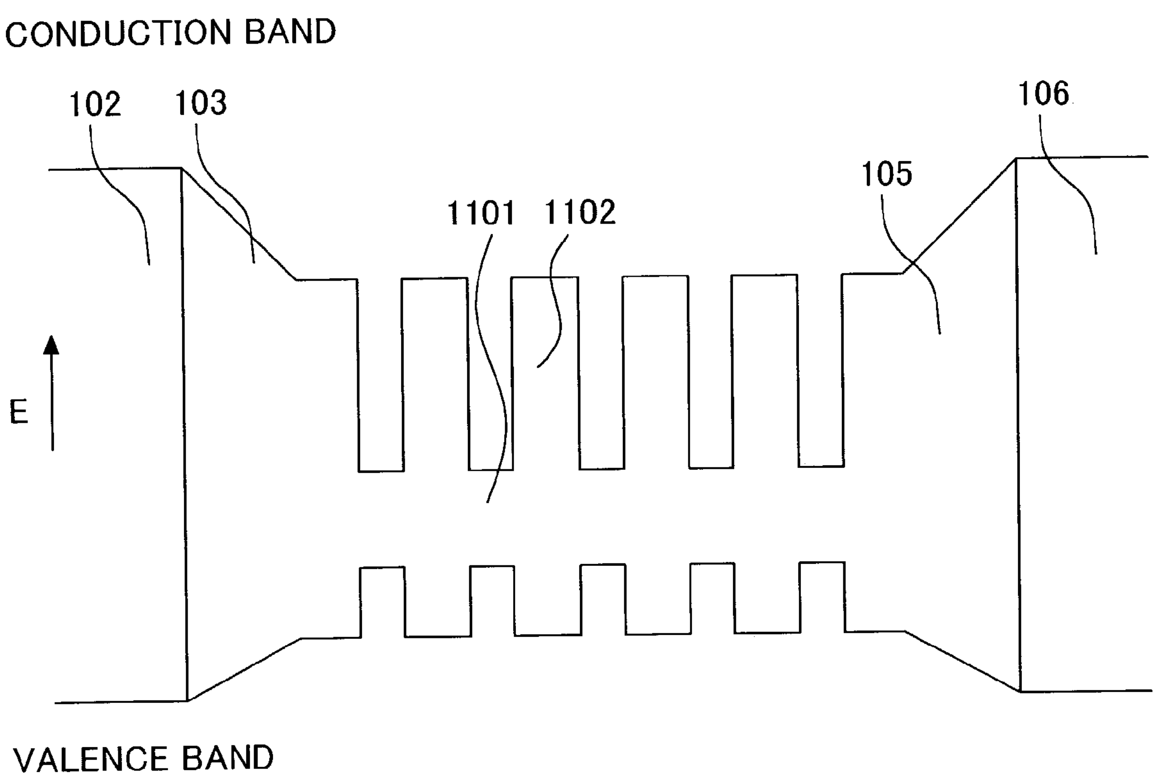
FIG. 12 shows the band structure of an InGaAlAs-MQW layer and an SHC layer.
Figure 13:
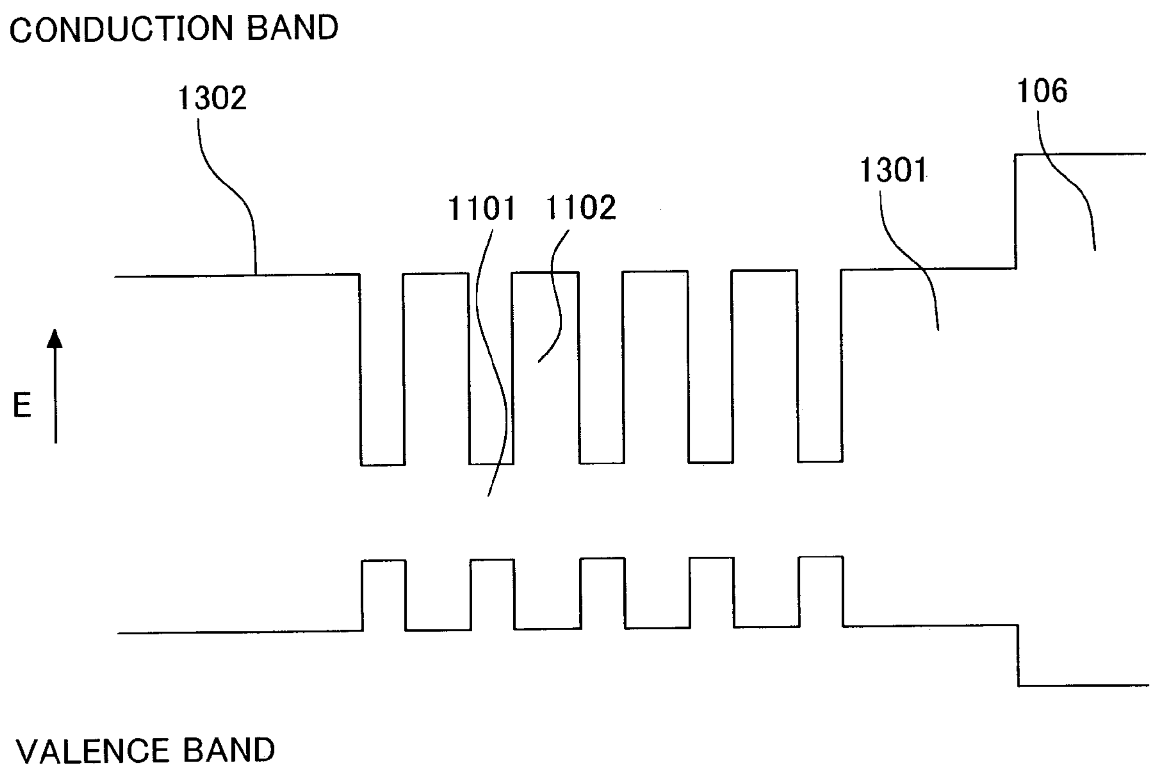
FIG. 13 shows the band structure of an InGaAlAs-MQW layer and an SHC layer.

The second reason for the high device resistance in the prior art lies in the grating and the band structure around it as described earlier. FIG. 4(*a*) is a cross sectional view of the present embodiment taken along line A–A' in FIG. 1 while FIG. 4(*b*) shows the band structure in cross section. In FIG. 4(*b*), bands 401, 402, 403 and 404 correspond respectively to the p-type InP cladding layer 108, p-type grating layer 107 and p-type InAlAs electron stopping layer 106 and p-type InGaAlAs GRIN-SCH layer 105 which are doped layers in the state of thermal equilibrium. As compared with the prior art one, the band structure in FIG. 4(*b*) is more notch-free. There are no notches except the one between 401 and 402. This is because the discontinuity of the valence band is small between the p-type InGaAsP layer 107 and the InAlAs electron stopping layer 106. Since the composition wavelength of the p-type InGaAsP layer 107 in the present embodiment is 1.15 μm, the discontinuity of the valence band is as extremely small as 9 meV. Further, since these layers are highly doped, the discontinuity of the band is made as small as shown in FIG. 4(*b*). In addition, unlike the prior art, the band structure of FIG. 4(*b*) does not vary depending on whether the path of concern goes through a concave or convex of the grating. Thus, current flows uniformly across the grating, resulting in a lower device resistance. Note that if the composition wavelength of the InGaAsP grating 107 is too short, concave and convex features of the grating collapse during regrowth and the selective removal of InP during mesa etching becomes poor. Therefore, the composition wavelength is preferably 1.15 μm or longer. In addition, since an excessively long composition wavelength enlarges the discontinuity of the band between the grating and the InAlAs electron stopping layer 106 and therefore causes notches, the composition wavelength is preferably 1.24 μm or shorter so that the discontinuity of the band is suppressed to 54 meV, about twice the thermal energy of an electron. In addition, taking optical absorption into consideration, the composition wavelength is preferably 1.21 μm or shorter since the oscillation wavelength is 1.3 μm in the present embodiment. Also note that although the grating layer is structured as a single composition wavelength one in the present embodiment, a similar effect can also be achieved by a multi-layered grating where each layer has a different composition wavelength.

Figure 14:
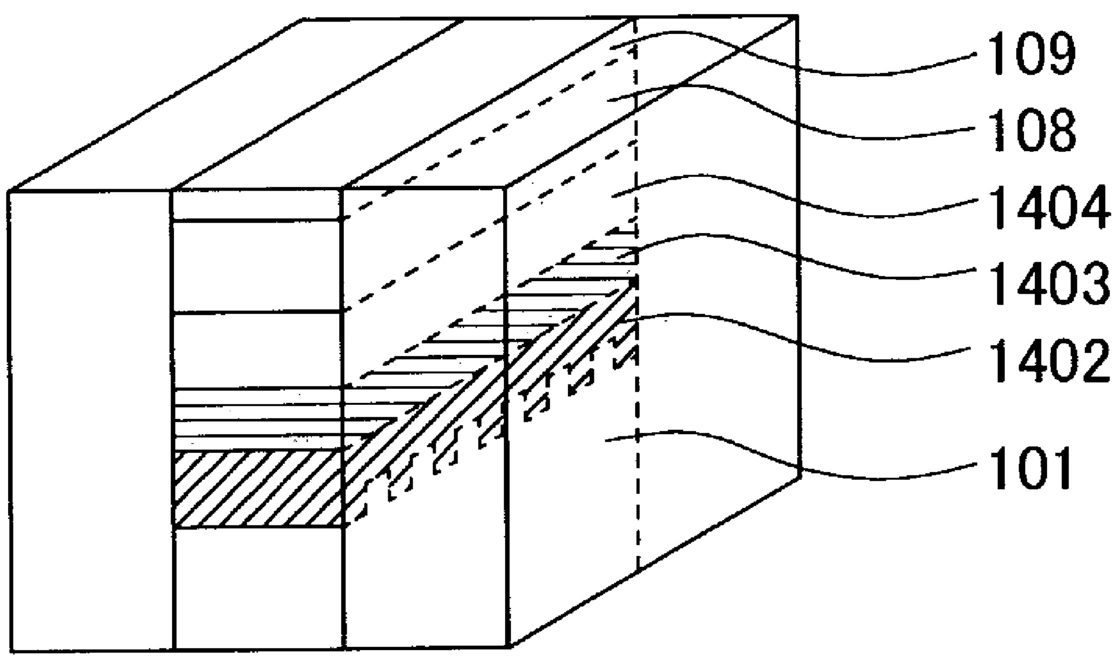
FIG. 14 shows the structure of another prior art example.
Figure 16:
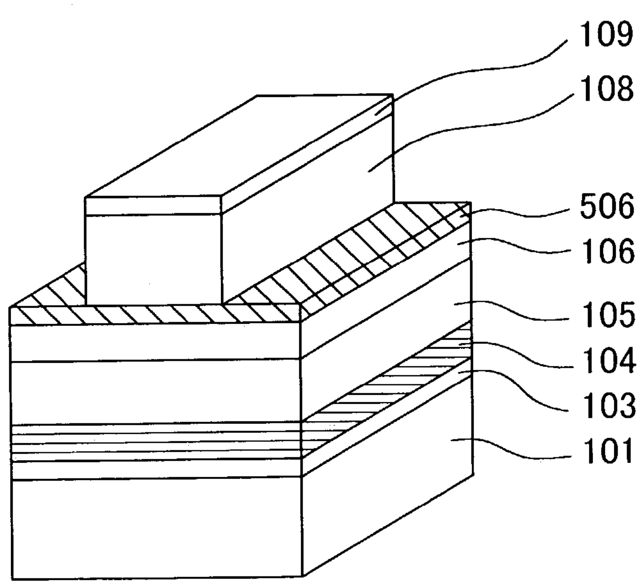
FIG. 16 shows the structure of another prior art example.

Shown in FIG. 16 is the structure disclosed in Japanese Patent Laid-open No. 11-54837. In this structure, although an InGaAsP etch stopping layer 506 is formed on an InAlAs electron stopping layer, the layers are continuously grown up to the p-type InP layer and the contact layer without regrowth. This structure is different from the present embodiment in that the InGaAsP layer is flat. Further this structure is greatly different from the present embodiment in that the composition wavelength of the layer is too short to form a grating. Shown in FIG. 14 is a prior art grating used mainly in a buried type laser. In this structure, a grating is a SCH layer having concave and convex features. The present embodiment is also different from this structure in that a separate grating layer is formed at a distance from the active layer and SCH layer.

Figure 17:
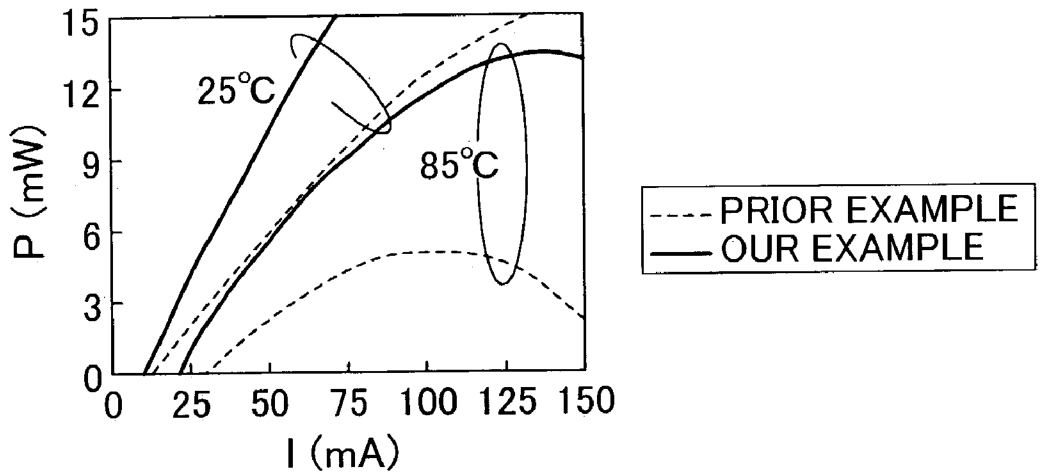
FIG. 17 is a graph showing an effect of the present invention.

By forming a 0.4% reflectance mirror film on the front facet of the present embodiment and a 90% reflectance mirror film on the rear facet, the present embodiment was completed as a distributed feedback laser having a 200 μm-long resonator. Reflecting the excellently low device resistance of 6.5 Ω realized according to the present invention, the distributed feedback laser achieved a low threshold current of 8.0 mA at 25° C. The threshold current was also as low as 19.2 mA even at a high temperature of 85° C. The slope efficiency was also as good as 0.23 W/A and 0.19 W/A at 25° C. and 85° C., respectively. Further, as shown in FIG. 17, the maximum optical output was about three times higher than that of the prior art. In addition, thanks to the λ/4 type grating formed by EB lithography where shifting is done behind the 8:2 position, the yield of single-mode ones was as good as 60%. Reflecting these characteristics, a good eye aperture was obtained in 10 G/s transmission with an extinction ratio of 7 dB at 85° C.

Embodiment 2

Figure 18:
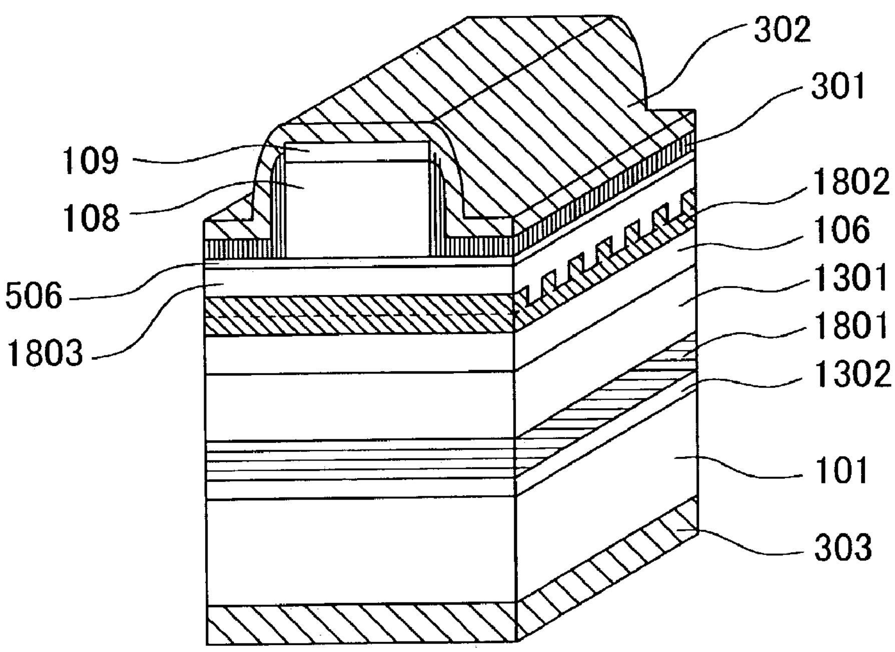
FIG. 18 shows the structure of a second embodiment of the present invention.

A second embodiment is an example of applying the present invention to a 1.55 μm band communication distributed feedback ridge type laser. FIG. 18 shows its structure. In FIG. 18, numeral 101 is an n-type InP substrate which also serves as a lower cladding layer. Numeral 1302 is a carrier-doped ($1\times10^{18}$ $cm^{-3}$) 0.08 μm-thick n-type InGaAlAs SCH layer having a composition wavelength of 0.95 μm. Numeral 1801 is a 0.122 μm-thick undoped InGaAlAs-MQW structure consisting of seven well and barrier layers. Each well layer is 6 nm thick and 1.4% strained compressively while each barrier layer is 10 nm thick and 0.6% strained tensilely. The composition is controlled so as to set the oscillation wavelength to 1.55 μm. Numeral 1301 is a carrier-doped ($6\times10^{17}$ $cm^{-3}$) 0.04 μm-thickness, 0.95 μm-composition wavelength p-type InGaAlAs SCH layer. Numeral 106 is a carrier-doped ($9\times10^{17}$ $cm^{-3}$) 0.04 μm-thick p-type InAlAs electron stopping layer. Numeral 1082 is a grating layer consisting of a carrier-doped ($1.4\times10^{18}$ $cm^{-3}$) 0.07 μm-thickness 1.15 μm-composition wavelength layer and a 0.03 μm-thickness 1.2 μm-composition wavelength p-type InGaAsP layer stacked on the former layer which is processed to form concave and convex features. Numeral 1803 is a carrier-doped (1.2×18 $cm^{-3}$) p-type InP spacer layer. Numeral 506 is a carrier-doped ($1.4\times10^{18}$ $cm^{-3}$) 1.15 μm-composition wavelength InGaAsP etch stopping layer. Numeral 108 is a carrier-doped ($1.2\times10^{18}$ $cm^{-3}$) 1.5 μm-thick p-type InP first upper cladding layer, a 1.8 μm-wide ridge-shaped mesa stripe. Numeral 109 is a contact layer to obtain ohmic contact with an electrode and is made of InGaAs which is lattice-matched with the InP substrate. Numeral 301 is a $SiO_2$ protection film, Numeral 302 is a p-side electrode and numeral 303 is a n-side electrode. The fabrication process is same as that for the embodiment 1 except that after the grating is formed, the InP spacer layer 1803 and InGaAsP etch stopping layer 506 and then InP cladding layer are grown continuously. One of the structural differences from the embodiment 1 is that the InP spacer layer 1803 and InGaAsP etch stopping layer 506 are inserted on the grating. Adding these layers makes it possible to control the coupling coefficient κ of the grating and the traverse harmonic mode cutoff width of the mesa stripe independently of each other. The coupling coefficient κ, corresponding to the Q factor in resonance phenomena, is positively correlated to the density of light in the grating layer. Therefore, bringing the grating layer close to the MQW active layer 1802 increases κ since the density of light in the grating layer is raised. Meanwhile, in order to secure optical coupling with optical fiber, the near field pattern in the laser must be a single-peak pattern with no traverse harmonic mode by the ridge mesa stripe. In the case of a ridge type laser, as the bottom of the ridge mesa stripe (i.e., the upper layer of 107 in FIG. 3 or the top of 506 in FIG. 18) comes closer to the active layer, the cutoff width of mesa (width of 108) must be made smaller. Narrowing the mesa raises the resistance of the 108 region and therefore results in an increased device resistance. In the structure of the first embodiment, κ and the traverse mode cutoff width cannot be controlled independently of each other in the structure of the first embodiment since the grating layer is at the bottom of the mesa stripe. To the contrary, in the case of the present embodiment, each of them can be controlled independently. Although vertically sandwiching the etch stopping layer 506 with InP layers causes notches, the device resistance is not much increased since this layer has no regrowth interface. Note that the InP spacer layer 1803 may also be made of InAlAs without deteriorating the effect.

By forming a 0.4% reflectance mirror film on the front facet of the present embodiment and a 90% reflectance mirror film on the rear facet, the present embodiment was completed as a distributed feedback laser having a 200 μm-long resonator. Reflecting the excellently low device resistance of 6.8 Ω realized according to the present invention, the distributed feedback laser achieved a low threshold current of 8.9 mA at 25° C. The threshold current was also as low as 22.4 mA even at a high temperature of 85° C. The slope efficiency was also as good as 0.19 W/A and 0.14 W/A at 25° C. and 85° C., respectively. In addition, thanks to the λ/4 type grating formed by EB lithography where shifting is done behind the 7:3 position, the yield of single-mode ones was as good as 56%. Reflecting these characteristics, a good eye aperture was observed in 10 G/s transmission with an extinction ratio of 7 dB at 85° C.

Embodiment 3

Figure 19:
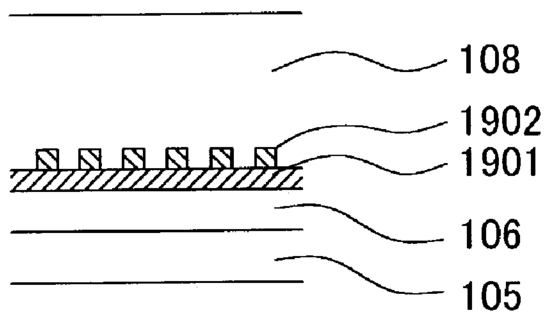
FIG. 19 shows the structure of a third embodiment of the present invention.
Figure 20:
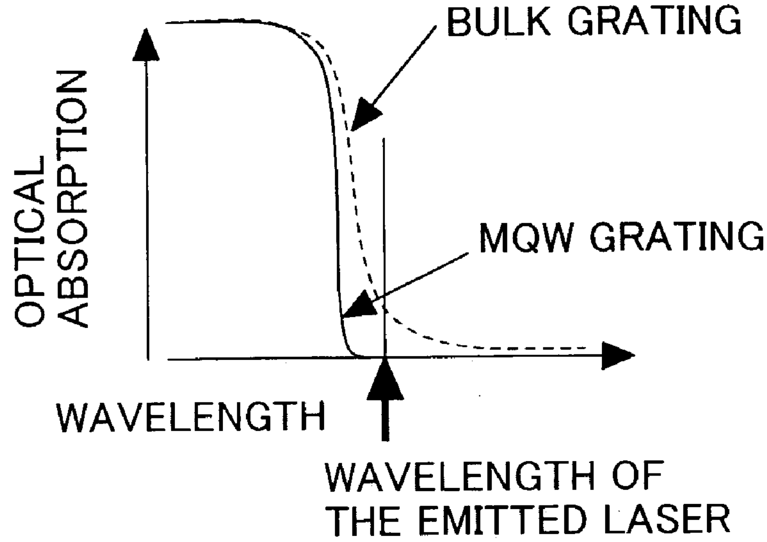
FIG. 20 is a diagram for explaining an effect of the present invention.

The present embodiment is an example of applying the present invention to a 1.3 μm band communication distributed feedback ridge type laser formed on an InP substrate. Its structure is same as the first embodiment except that part of the grating layer 107 is of an InGaAsP quantum well structure. FIG. 19 is a cross sectional view of the present embodiment taken along line A–A' in FIG. 1. In FIG. 19, numeral 1901 is a carrier-doped ($1.4\times10^{18}$ $cm^{-3}$) 0.04 μm-thickness 1.15 μm-composition wavelength InGaAsP layer. Numeral 1902 is a uniformly carrier-doped ($1.2\times10^{18}$ $cm^{-3}$) InGaAsP-MQW layer consisting of three well and barrier layers. A well layer is 4 nm thick and a barrier layer is 7 nm thick. The composition wavelength of the InGaAsP-MQW layer 1902 is controlled to 1.22 μm. Although the composition wavelength of the well layer is about 1.31 μm in this case, notches and the resulting increase in the device resistance are small since the well layer is narrow and the density of states in the well layer is small due to the quantum effect of the well layer. The grating is formed by dry-etching only the MQW layer through a process similar to that for the first embodiment. Forming the grating as a MQW structure can reduce the absorption of the grating, in particular, at high temperatures without changing the concave depth and coupling coefficient κ. This leads to raised laser performance at high temperatures. FIG. 20 schematically compares the MQW grating with the ordinary bulk grating used in the first and second embodiments in terms of the optical absorption versus wavelength relation with the same coupling coefficient κ and concave depth. While the bulk grating generally shows a tail, the MQW grating shows a sharp curve with no tail and therefore does not absorb much light at the laser oscillation wavelength. The oscillation wavelength of the distributed feedback laser does not shift more than 0.1 nm/° C. to the longer wavelength while the absorption versus wavelength curve shifts at a rate of 0.6 nm/° C. to the longer wavelength if the grating is a bulk grating. Therefore, absorption by the grating increases according as the temperature rises if the grating is a bulk grating. Meanwhile, in the case of the MQW grating, good laser performance is obtained since its optical absorption is small at high temperatures.

By forming a 0.4% reflectance mirror film on the front facet of the present embodiment and a 90% reflectance mirror film on the rear facet, the present embodiment was completed as a distributed feedback laser having a 200 μm-long resonator. Reflecting the excellently low device resistance of 7.0 Ω realized according to the present invention, the distributed feedback laser achieved a low threshold current of 7.5 mA at 25° C. The threshold current was also as low as 17.2 mA even at a high temperature of 85° C. The slope efficiency was also as good as 0.25 W/A and 0.21 W/A at 25° C. and 85° C., respectively. In addition, thanks to the λ/4 type grating formed by EB lithography where shifting is done behind the 8:2 position, the yield of single-mode ones was as good as 60%. Reflecting these characteristics, a good eye aperture was observed in 10 G/s transmission with an extinction ratio of 7 dB at 85° C.

Note that although the MQW grating layer is uniformly doped in the present embodiment, it is also possible not to dope the well layer or whole MQW grating layer in order to make the absorption curve still sharper. In addition, although the wavelength of the MQW grating is made shorter than the laser oscillation wavelength, it is also possible to form the MQW grating as a gain-coupled grating by making the wavelength equal to the oscillation wavelength. In this case, to allow the grating to have a gain without deteriorating the laser characteristics, it is necessary to appropriately thin the SCH layer 105 and electron stopping layer 106 so that electrons somewhat leak into the grating.

Also needless to say, the structure of the present embodiment can also be modified in such a manner that a p-type InP spacer layer and a etch stopping layer are inserted onto the MQW grating and p-type InP cladding layer in the same manner as the second embodiment.

Further needles's to say, although the first to third embodiments are ridge type lasers, similar effects can be obtained by applying them to buried type lasers. Similarly needless to say, although the first to third embodiments are discrete distributed feedback lasers, similar effects can be obtained by applying them to electro-absorption modulator-integrated distributed feedback lasers.

The present invention is effective in reducing the device resistance of a distributed feedback laser having an InGaAlAs MQW active layer and therefore improving its laser characteristics such as threshold current at high temperature, efficiency and maximum optical output.

While the invention has been described in its preferred embodiments, it is to be understood that the words which have been used are words of description rather than limitation and that changes within the purview of the appended claims may be made without departing from the true scope and spirit of the invention in its broader aspects.

To facilitate understanding of the drawings, the following provides a description of major numerals.

101: n-type InP substrate
102: n-type InAlAs layer
103: n-type InGaAlAs GRIN-SCH layer

104: InGaAlAs-MQW layer
105: P-type InGaAlAs GRIN-SCH layer
106: p-type InAlAs electron stopping layer
107: p-type InGaAsP grating layer
108: p-type InP cladding layer
109: p-type InGaAs layer
201: $SiO_2$ film
301: $SiO_2$ protection film
302: p-side electrode
303: n-side electrode
401: Band structure of p-type InP cladding layer 108
402: Band structure of p-type InGaAsP grating layer 107
403: Band structure of p-type InAlAs electron stopping layer 106
404: Band structure of p-type InGaAlAs GRIN-SCH layer 105
502: n-type SCH layer
503: Active layer
504: p-type SCH layer
505: p-type InP layer
506: p-type InGaAsP etch stopping layer
507: p-type InP layer
508: p-type InGaAsP layer
701: n-type dopant impurity
1001: Band structure of p-type InP cladding layer 108
1002: Band structure of p-type InGaAsP grating layer 508
1003: Band structure of p-type InP layer 507
1101: InGaAlAs quantum well layer
1102: InGaAlAs barrier layer
1103: InGaAsP quantum well layer
1104: InGaAsP barrier layer.
1301: P-type InGaAlAs-SCH layer
1302: n-type InGaAlAs-SCH layer
1402: Grating-formed n-type InGaAsP SCH layer
1403: InGaAsP-MQW active layer
1404: p-type InGaAsP SCH layer
1801: 1.55 μm band InGaAlAs-MQW layer
1802: Composition wavelength-varied multi-layered grating layer
1803: p-type InP spacer layer
1901: InGaAsP layer
1902: InGaAsP-MQW grating layer

What is claimed is:

1. An optical semiconductor device comprising:
an InP substrate;
a plurality of layers, stacked on the InP substrate, including a multi-quantum well active layer made of InGaAlAs;
an InAlAs electron stopping layer stacked on the plurality of layers;
an InGaAsP layer including a grating stacked on the InAlAs electron stopping layer; and
an InP cladding layer stacked on the InGaAsP layer;
wherein the grating has alternating concave parts and convex parts, the concave parts having a concave depth terminating in a continuous portion of the grating, such that the concave depth of the grating is smaller than a maximum thickness of the InGaAsP layer.

2. An optical semiconductor device comprising:
an InP substrate;
a plurality of layers, stacked on the InP substrate, including a multi-quantum well active layer made of InGaAlAs;
an InAlAs electron stopping layer stacked on the plurality of layers;
an InGaAsP layer including a grating stacked on the InAlAs electron stopping layer;
an InP spacer layer stacked on the InGaAsP layer;
an InGaAsP etch stopping layer stacked on the InP spacer layer; and
an InP cladding layer stacked on the InGaAsP etch stopping layer;
wherein the grating has alternating concave parts and convex parts, the concave parts having a concave depth terminating in a continuous portion of the grating, such that the concave depth of the grating is smaller than a maximum thickness of the InGaAsP layer.

3. An optical semiconductor device according to claim 2, wherein the spacer layer comprises an InAlAs layer.

4. An optical semiconductor device according to claim 1, wherein a composition wavelength of the InGaAsP layer including the grating is not shorter than 1.15 μm and not longer than 1.24 μm.

5. An optical semiconductor device according to claim 2, wherein a composition wavelength of the InGaAsP layer including the grating is not shorter than 1.15 μm and not longer than 1.24 μm.

6. An optical semiconductor device according to claim 3, wherein a composition wavelength of the InGaAsP layer including the grating is not shorter than 1.15 μm and not longer than 1.24 μm.

7. An optical semiconductor device according to claim 1, wherein a portion of the InGaAsP layer including the grating consists of a multi-quantum well layer.

8. An optical semiconductor device according to claim 2, wherein a portion of the InGaAsP layer including the grating consists of a multi-quantum well layer.

9. An optical semiconductor device according to claim 3, wherein a portion of the InGaAsP layer including the grating consists of a multi-quantum well layer.

10. An optical semiconductor device according to claim 1, wherein impurity dopants including at least one of Si and O exist between the InP cladding layer and the InGaAsP layer including the grating.

11. An optical semiconductor device according to claim 2, wherein impurity dopants including at least one of Si and O exist between the InP spacer layer and the InGaAsP layer including the grating.

12. An optical semiconductor device according to claim 1, wherein the optical semiconductor device is a ridge type laser in which the InP cladding layer has a shape of a ridge mesa stripe.

13. An optical semiconductor device according to claim 2, wherein the optical semiconductor device is a ridge type laser in which the InP cladding layer has a shape of a ridge mesa stripe.

14. An optical semiconductor device according to claim 1, wherein the optical semiconductor device is a buried type laser.

15. An optical semiconductor device according to claim 1, wherein the optical semiconductor device is an integrated light source in which a laser structure and an electro-absorption modulator are integrated.

16. An optical semiconductor device according to claim 2, wherein the optical semiconductor device is an integrated light source in which a laser structure and an electro-absorption modulator are integrated.

17. An optical semiconductor device according to claim 13, wherein the optical semiconductor device is an integrated light source in which a laser structure and an electro-absorption modulator are integrated.

18. An optical semiconductor device according to claim 14, wherein the optical semiconductor device is an integrated light source in which a laser structure and an electro-absorption modulator are integrated.

19. An optical semiconductor device according to claim 1, wherein the optical semiconductor device is an integrated light source in which a laser structure and a Mach-Zender modulator are integrated.

20. An optical semiconductor device according to claim 2, wherein the optical semiconductor device is an integrated light source in which a laser structure and a Mach-Zender modulator are integrated.

21. An optical semiconductor device comprising:

an InP substrate;

a plurality of layers, stacked on the InP substrate, including a multi-quantum well active layer made of InGaAlAs;

an InAlAs electron stopping layer stacked on the plurality of layers;

a group of InGaAsP layers including a grating stacked on the InAlAs electron stopping layer; and an InP cladding layer stacked on the InGaAsP layer;

wherein the grating has alternating concave parts and convex parts, the concave parts having a concave depth terminating in a continuous portion of the grating, such that the concave depth of the grating is smaller than a maximum thickness of the group of InGaAsP layers.

22. An optical semiconductor device comprising:

an InP substrate;

a plurality of layers, stacked on the InP substrate, including a multi-quantum well active layer made of InGaAlAs;

an InAlAs electron stopping layer stacked on the plurality of layers;

a group of the InGaAsP layers including a grating stacked on the InAlAs electron stopping layer;

an InP spacer layer stacked on the InGaAsP layer;

an InGaAsP etch stopping layer stacked on the InP spacer layer; and an InP cladding layer stacked on the InGaAsP etch stopping layer;

wherein the grating has alternating concave parts and convex parts, the concave parts having a concave depth terminating in a continuous portion of the grating, such that the concave depth of the grating is smaller than a maximum thickness of the InGaAsP layer.

* * * * *